United States Patent
Gates et al.

(10) Patent No.: US 9,305,836 B1
(45) Date of Patent: Apr. 5, 2016

(54) AIR GAP SEMICONDUCTOR STRUCTURE WITH SELECTIVE CAP BILAYER

(71) Applicant: International Business Machines Corporation, Armonk, NY (US)

(72) Inventors: Stephen M. Gates, Ossining, NY (US); Elbert E. Huang, Carmel, NY (US); Dimitri R. Kioussis, San Diego, CA (US); Christopher J. Penny, Saratoga Springs, NY (US); Deepika Priyadarshini, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/536,751

(22) Filed: Nov. 10, 2014

(51) Int. Cl.
*H01L 23/48* (2006.01)
*H01L 21/768* (2006.01)
*H01L 23/528* (2006.01)
*H01L 23/532* (2006.01)
*H01L 21/311* (2006.01)

(52) U.S. Cl.
CPC ...... *H01L 21/7682* (2013.01); *H01L 21/31111* (2013.01); *H01L 21/7685* (2013.01); *H01L 21/76802* (2013.01); *H01L 21/76834* (2013.01); *H01L 23/528* (2013.01); *H01L 23/5329* (2013.01); *H01L 23/53209* (2013.01); *H01L 23/53223* (2013.01); *H01L 23/53238* (2013.01); *H01L 23/53252* (2013.01); *H01L 23/53266* (2013.01)

(58) Field of Classification Search
None
See application file for complete search history.

(56) References Cited

U.S. PATENT DOCUMENTS

| 7,514,361 | B2 | 4/2009 | Bonilla et al. |
| 7,635,646 | B2 | 12/2009 | Omoto et al. |
| 7,666,753 | B2 | 2/2010 | Bonilla et al. |
| 7,741,228 | B2 | 6/2010 | Ueki et al. |
| 7,842,600 | B2 | 11/2010 | Yun et al. |
| 8,274,155 | B2 | 9/2012 | Usami |
| 8,304,906 | B2 | 11/2012 | Huang et al. |
| 8,399,350 | B2 | 3/2013 | Nogami et al. |
| 8,716,127 | B2 | 5/2014 | Yang et al. |
| 8,779,590 | B2 | 7/2014 | Isobayashi |
| 2008/0026541 | A1 | 1/2008 | Edelstein et al. |
| 2009/0075470 | A1 | 3/2009 | Nitta et al. |
| 2009/0200636 | A1* | 8/2009 | Edelstein ............ H01L 21/0273 257/522 |
| 2011/0221062 | A1* | 9/2011 | Clevenger ......... H01L 21/02126 257/750 |
| 2013/0292835 | A1* | 11/2013 | King ................. H01L 21/02178 257/741 |

OTHER PUBLICATIONS

U.S. Appl. No. 14/960,483, filed Dec. 7, 2015, Entitled "Air Gap Structure With Bilayer Selective Cap".
U.S. Appl. No. 14/961,966, filed Dec. 8, 2015, Entitled "Air Gap Structure With Bilayer Selective Cap".
List of IBM Patents or Patent Applications Treated As Related, dated Dec. 8, 2015, 2 pages.

* cited by examiner

*Primary Examiner* — Bilkis Jahan
(74) *Attorney, Agent, or Firm* — Alexa L. Ashworth

(57) ABSTRACT

A semiconductor substrate including one or more conductors is provided. A first layer and a second layer are deposited on the top surface of the conductors. A dielectric cap layer is formed over the semiconductor substrate and air gaps are etched into the dielectric layer. The result is a bilayer cap air gap structure with effective electrical performance.

10 Claims, 7 Drawing Sheets

AIR GAP SEMICONDUCTOR STRUCTURE WITH SELECTIVE CAP BILAYER

BACKGROUND OF THE INVENTION

The present invention relates generally to semiconductor devices, and more particularly to the formation of air gap structures in a semiconductor device with a bilayer selective cap.

Semiconductor devices generally include a plurality of circuits which form an integrated circuit fabricated on a semiconductor substrate. To improve the performance of the circuits, low k dielectric materials, having a dielectric constant of less than silicon dioxide, are used between circuits as inter-layer dielectric (ILD) to reduce capacitance. Interconnect structures made of metal lines are usually formed in and around the ILD material to connect elements of the circuits. Within a typical interconnect structure, metal lines run parallel to the semiconductor substrate. An interconnect structure may consist of multilevel or multilayered schemes, such as, single or dual damascene wiring structures.

Manufacture of a semiconductor device, also called an electronic device or integrated circuit, is normally divided into two major phases. The "front end of the line" (FEOL) is dedicated to the creation of all transistors in the body of the semiconductor devices, and the "back end of the line" (BEOL) creates the metal interconnect structures which connect the transistors to each other, as well as provide power to the devices. Once all active components are created, the BEOL manufacturing begins.

Air gap structures, which may be used in flash memory chips, are known to reduce capacitance in the interconnect back end of the line (BEOL) structures of high performance integrated circuits. Integration processes used in the formation of air gap structures are known in some cases to attack the copper (Cu) conductors, resulting in poor reliability, an increase in resistance, and open conductors.

SUMMARY

According to one embodiment of the present invention, a semiconductor structure is provided, the semiconductor structure comprising: a dielectric layer present on a semiconductor substrate; one or more conductors within the dielectric layer, wherein the one or more conductors have a top surface; a bilayer cap present on the one or more conductors, wherein the bilayer cap comprises a first layer and a second layer; and a plurality of air gaps, wherein the air gaps are etched into the dielectric layer.

According to another embodiment of the present invention, a method for forming a semiconductor air gap structure is provided, the method comprising: providing a semiconductor substrate with one or more conductors within a dielectric layer, wherein the one or more conductors have a top surface; depositing a first layer on the top surface of the one or more conductors; forming a second layer on the first layer; forming a dielectric cap layer over the semiconductor substrate; and etching one or more air gaps to a selected depth within the dielectric layer.

DETAILED DESCRIPTION

Figure 1:
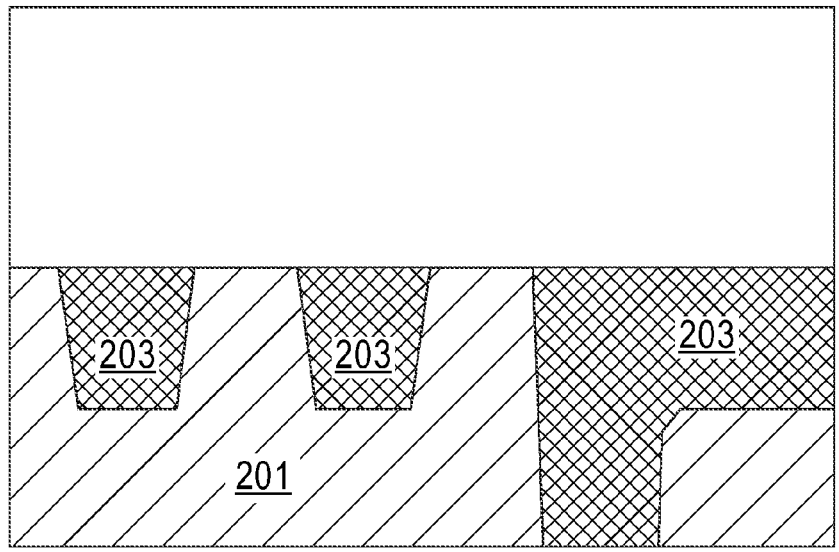
FIG. 1 depicts an example of a substrate on which an air gap structure with a bilayer selective cap may be formed, in accordance with an embodiment of the present invention.

Embodiments generally provide an air gap structure between metal conductors, including a bilayer self-aligned cap on the metal conductors, used as part of an electronic device structure. Herein, the terms "semiconductor device" and "electronic device" are used to mean an integrated circuit. Embodiments of the present invention provide improved electrical performance in semiconductor devices through power savings and increasing the speed of signal propagation. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "on", "over", "overlying", "atop", "positioned on", or "positioned atop" mean that a first element, such as a first structure, is present on a second element, such as a second structure, wherein intervening elements, such as an interface structure, may be present between the first element and the second element. The terms "direct contact", "directly on", or "directly over" mean that a first element, such as a first structure, and a second element, such as a second structure, are connected without any intermediary conducting, insulating, or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Referring now to the figures, FIG. 1 depicts an example of substrate 100 on which an air gap structure with a bilayer selective cap may be formed. Substrate 100 contains a plurality of conductors 203, formed within dielectric 201. Dielectric 201 may be composed of any dielectric material(s) known in the art. In this exemplary embodiment, conductors 203 are patterned, and are composed of copper (Cu) with a barrier layer on all lower surfaces of the Cu (not depicted in FIG. 1), as known in the art. In other embodiments, conductors 203 may be composed of aluminum or tungsten.

Figure 2:
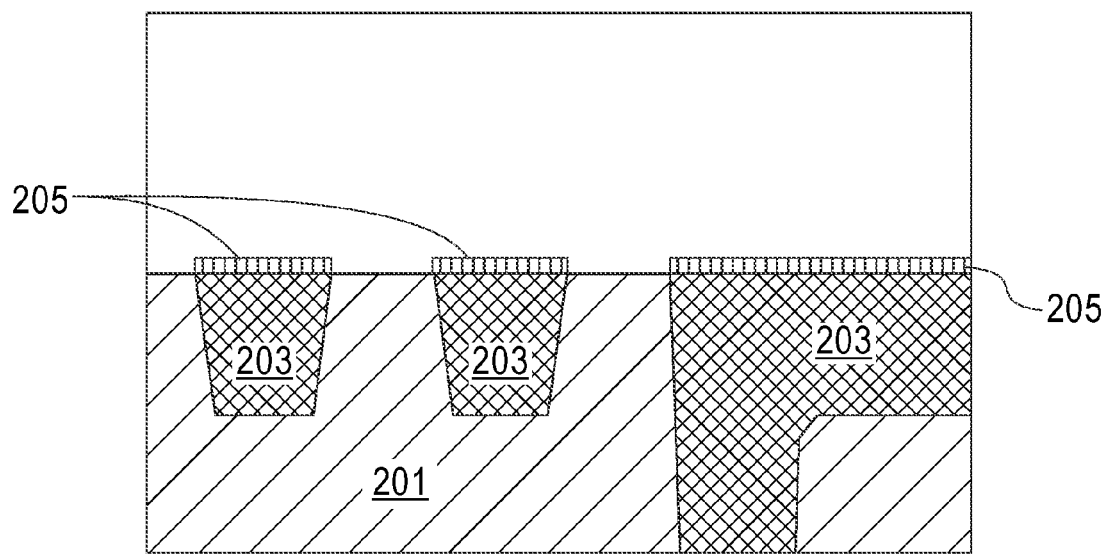
FIG. 2 depicts a first layer of the self-aligned cap deposited on the semiconductor device of FIG. 1, in accordance with an embodiment of the present invention.

FIG. 2 depicts adhesive layer 205 deposited on the upper surface of conductors 203. Adhesive layer 205 is the first layer of the self-aligned bilayer cap and is composed of any suitable metal capping material including, but not limited to, cobalt (Co), manganese (Mn), tantalum (Ta), ruthenium (Re), aluminum (Al), nickel (Ni), tungsten (W), platinum (Pt), palladium (Pd), rhenium (Re), and any alloy or combination thereof. In other embodiments, adhesive layer 205 is electroless metal capping layers including, but not limited to, CoWP, CoWB, and NiWP, or is a selective CVD Ru cap. In this exemplary embodiment, adhesive layer 205 is formed using a selective metal deposition process. For example, substrate 100 is placed in a deposition chamber and a process known in the art, such as a chemical vapor deposition (CVD) or a liquid phase deposition, is used to form a metal layer. The metal layer may have a thickness ranging from 1 nm to 10 nm, with an example thickness of 4 nm. Adhesive layer 205 is in strong adhesive contact with conductors 203, which facilitates copper reliability under use conditions.

Figure 3:
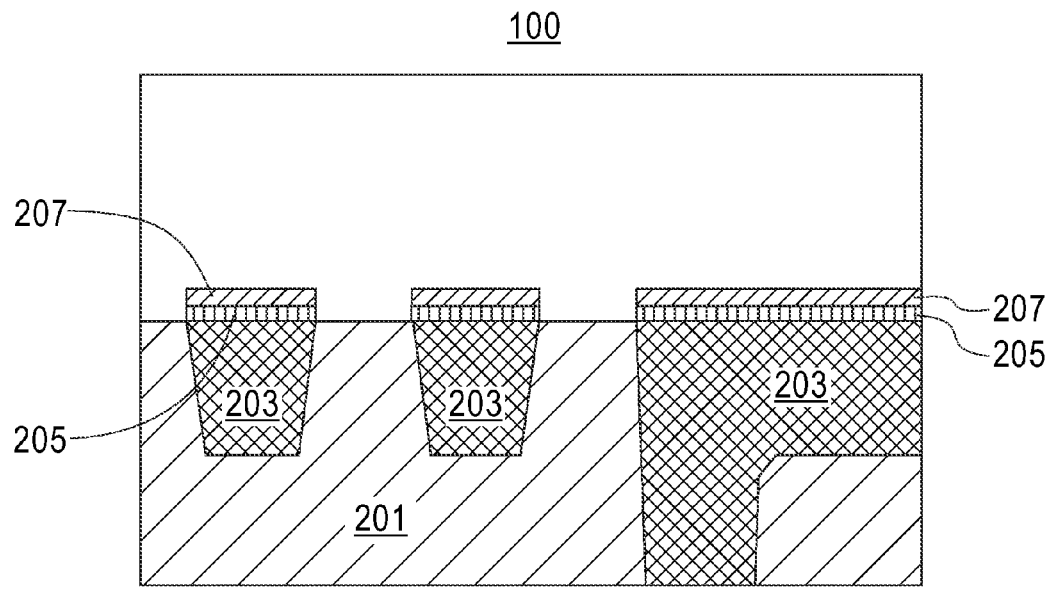
FIG. 3 depicts a second layer of the self-aligned cap deposited on the first layer of the self-aligned cap of FIG. 2, in accordance with an embodiment of the present invention.

FIG. 3 depicts protective layer 207 deposited over the surface of adhesive layer 205. Protective layer 207 is the second layer of the self-aligned bilayer cap and is a compound of adhesive layer 205. Protective layer 207 may be composed of any suitable capping material including, but not limited to, SiCH, SiCNH, amorphous C or CH, and metal compounds of adhesive layer 205 including one or more of the elements C, Si, N, H. Example compositions include $MC_x$, $MN_y$, $MC_xN_y$, $MSi_xC_y$, $MSi_xN_y$, and $MSi_xN_yC_z$, where M is selected from the metals listed above for adhesive layer 205. Examples of preferred compositions are CoCH, CoSiNCH, and $CoSi_x$. In this exemplary embodiment, the deposition of adhesive layer 205 and protective layer 207 are formed in one continuous process with no air exposure. In other embodiments, protective layer 207 is formed as a result of a chemical modification of the top surface of adhesive layer 205.

In one embodiment, protective layer 207 is formed by a thermal process using certain reactive gases. This involves heating substrate 100 to higher temperatures. According to one embodiment of the invention, substrate 100 is heated to 200° C. to 400° C. According to another embodiment of the invention, substrate 100 is preferably heated to 350° C. to 400° C. According to yet another embodiment of the invention, the temperature of substrate 100 is maintained at a temperature below 400° C. After the stabilization of the temperature of substrate 100, the surface is exposed to a gas phase mixture containing nitrogen (N), carbon (C), silicon (Si), hydrogen (H), or a mixture of these elements. The gas phase mixture may be formed by flowing one or more precursors selected from: $N_2$, $NH_3$, ethylene ($C_2H_4$), trimethylsilane, tetramethylsilane, dimethylsilane, dimethyl silacyclopentane, cyclic silazanes, trisilylamine (TSA), disilane, silane, cyclic hydrocarbons, linear hydrocarbons, and silicon substituted cyclic hydrocarbons. Substrate 100 is held at this condition for a period of time ranging from 15 seconds to 300 seconds. Exposure to these gases under thermal conditions results in insertion of nitrogen, carbon, silicon, or all of these elements into the metal layer. This step is referred to as the "reactive gas" step in the process embodiments described here. The resulting composition is an alloy with a low etch rate in dilute HF. In this exemplary embodiment, the timing of the reactive gas step is controlled, so that strong adhesion of the bilayer cap to the copper conductors is maintained to prevent the entire bilayer from reacting.

In another embodiment of the present invention, protective layer 207 is formed by a direct plasma process using certain reactive gases. This involves striking the plasma in the presence of a precursor gas to form protective layer 207. A gentle plasma modification is used, according to an embodiment, wherein the plasma power is between 100 W to 400 W, for example. In other embodiments, other plasma powers and remote plasma configurations may be used within the invention. The precursor gas used, according to this embodiment, is selected from the group of gases listed above. Exposure to the precursor gases under the plasma conditions results in insertion of nitrogen, carbon, silicon, or all of these elements, into the metal layer. Substrate 100 is held at this condition for a time period ranging from 5 seconds to 60 seconds. In this exemplary embodiment, the timing of the plasma with reactive gas step is controlled, so that strong adhesion of the bilayer cap to the copper conductors is maintained.

According to yet another embodiment of the present invention, protective layer 207 is formed by introducing reactive gases in the presence of UV light. According to one aspect of this embodiment, substrate 100 is kept at a low temperature, such as 200° C. to 250° C. According to another aspect of this embodiment, substrate 100 is kept at a higher temperature, such as 250° C. to 400° C. The precursor gases, according to one aspect of this invention, are selected from the group of gases listed above. Substrate 100 is held at this condition for a time period ranging from 10 seconds to 300 seconds. Excitation of UV light in the presence of the precursor gases results in modification of the metal layer, forming protective layer 207 of the self-aligned bilayer cap. The time of the UV light with reactive gas step is controlled, so that strong adhesion of the bilayer cap to the copper conductors is maintained.

In another embodiment, adhesive layer 205 and/or protective layer 207 are deposited by a second selective CVD or an electroless metal deposition process. For example, if CoWP is deposited as adhesive layer 205, in order to provide effective electromigration, a second selective NiWP layer may be deposited atop the CoWP layer to provide protection of the CoWP layer during the air gap processing. In other embodiments, a liquid phase deposition may be used to deposit adhesive layer 205 and/or protective layer 207.

According to an embodiment of the present invention, the thermal and plasma surface modifications described above are combined. According to this embodiment, substrate 100 is heated to a higher temperature than described above, prior to striking the plasma in the presence of the reactive gasses.

According to another embodiment of the present invention, the plasma and UV surface modification processes described above are combined in a cyclic manner, where a short plasma process is followed by a UV step, or the UV step may be followed by the short plasma process. Use of the energetic UV or plasma steps in a cyclic manner may help to improve the density and composition of protective layer 207, causing protective layer 207 to be more chemically inert during the air gap formation.

According to yet another embodiment of the present invention, protective layer 207 is formed in multiple sub-layers, where the first layer of the multiple sub-layers provides strong adhesion to copper conductors 203. According to this embodiment, the cyclic deposition of adhesive layer 205 and a reactive gas step, as described above, are performed in alternating steps. After adhesive layer 205 is deposited, the cycles for deposition of protective layer 207 are mixed with the reactive gas thermal, UV, or plasma modification steps (as described above). This process results in a more uniform modification of protective layer 207, and may improve the density and composition of protective layer 207.

Figure 4:
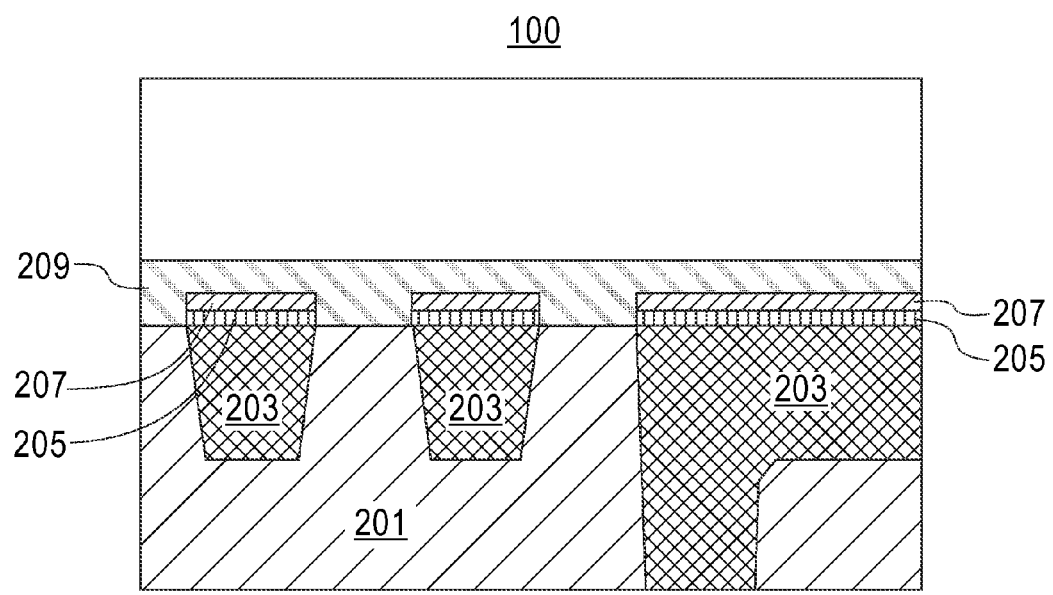
FIG. 4 depicts a dielectric layer formed on an upper surface of a substrate for the semiconductor device of FIG. 1, in accordance with an embodiment of the present invention.

FIG. 4 depicts dielectric cap layer 209 formed on the upper surface of substrate 100. In this exemplary embodiment, the entire structure is enclosed by the deposition of dielectric cap layer 209. Dielectric cap layer 209 protects the structure from oxidation by exposure to air and other effects by the environment while substrate 100 is being prepared for subsequent process steps.

Figure 5:
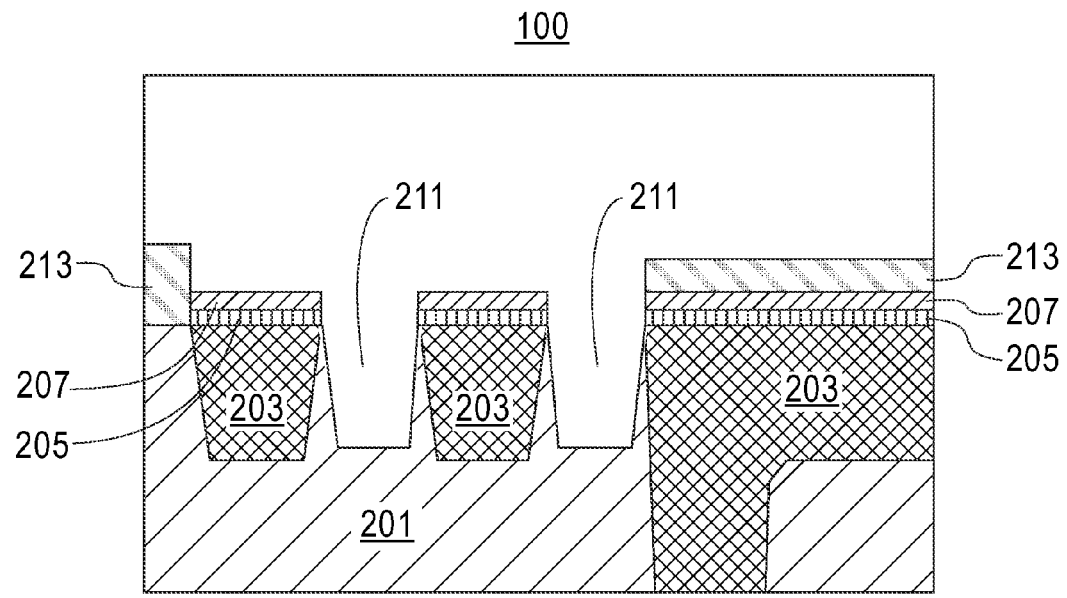
FIG. 5 depicts the formation of air gap structures, in accordance with an embodiment of the present invention.

FIG. 5 depicts the formation of air gap structures, in accordance with an embodiment of the present invention. In this exemplary embodiment, lithography techniques known in the art are used to select one or more locations for air gaps 211, and to block non-air gap locations during subsequent process steps. Openings are etched into dielectric 201, and are continued to be etched to the selected depth, which may be from 2 nm to 50 nm below the upper surface of Cu conductors 203. In some embodiments, the etched depth may correspond to the bottom surface of Cu conductors 203. After air gaps 211 have been formed, dielectric cap layer 213 is the layer that remains from dielectric cap layer 209. Dielectric cap layer 213 covers the regions of the substrate that were blocked from selection for air gap formation. In this exemplary embodiment, dielectric cap layer 213 is patterned after air gaps 211 have been etched, using known patterning techniques in the art. In other embodiments, dielectric cap layer 213 is removed completely either after air gaps 211 formation or, alternatively, after a wet cleaning process (discussed below).

Figure 6:
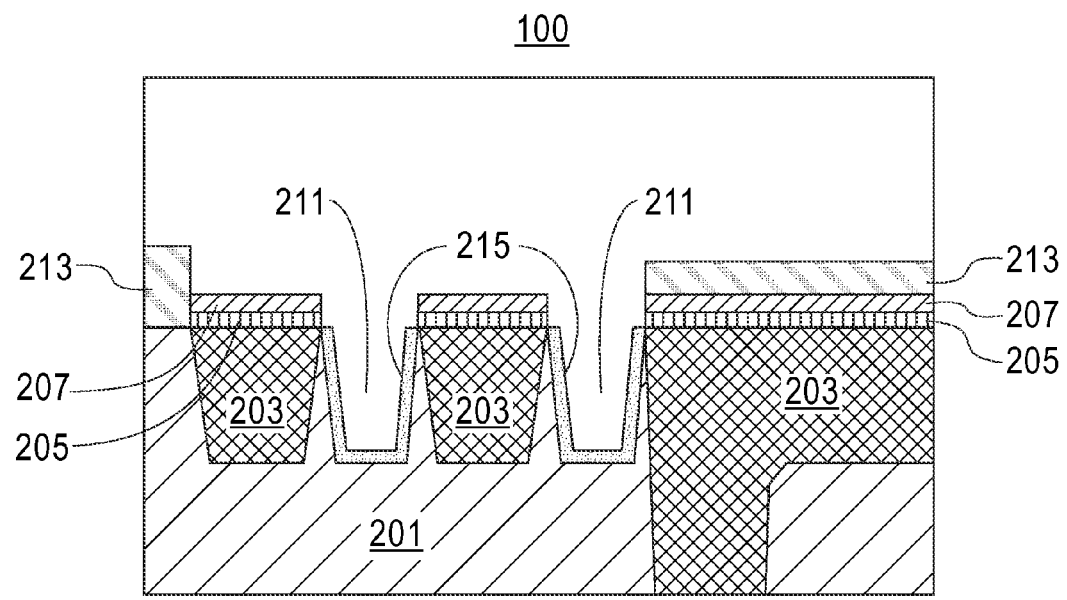
FIG. 6 depicts the formation of a modified layer within the air gap structure, in accordance with an embodiment of the present invention.

FIG. 6 depicts the formation of modified layer 215 within air gaps 211, in accordance with an embodiment of the present invention. In this exemplary embodiment, a plasma treatment is performed on substrate 100 resulting in a damaged layer, modified layer 215, on dielectric 201 within air gaps 211. During the plasma treatment, the plasma modifies dielectric 201 by removing C structures, such as $CH_3$, resulting in modified layer 215.

Figure 7:
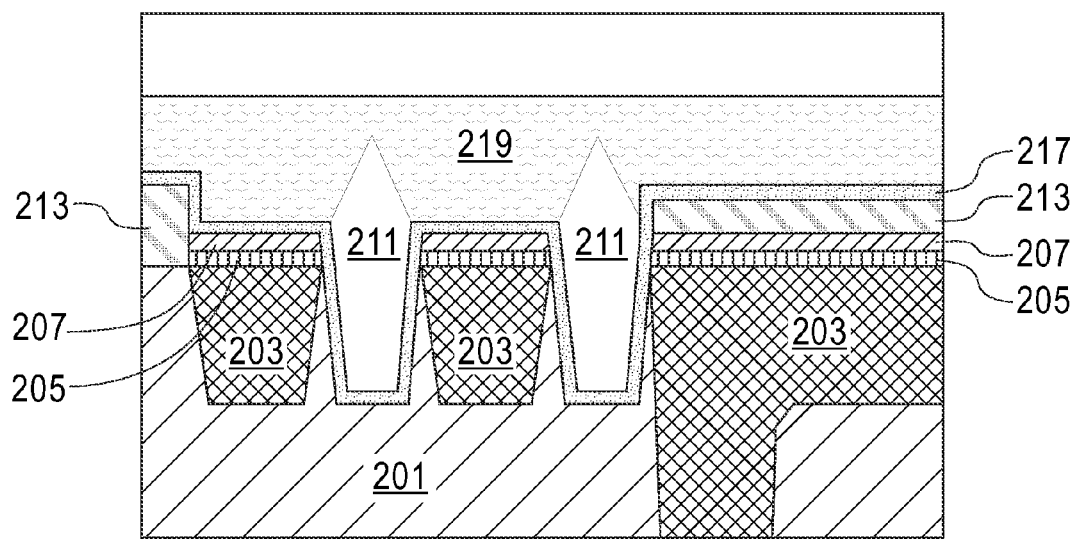
FIG. 7 depicts the deposition of the conformal cap layer and the non-conformal cap layer, in accordance with an embodiment of the present invention.

FIG. 7 depicts the deposition of conformal cap layer 217 and non-conformal cap layer 219, in accordance with an embodiment of the present invention. Subsequent to performing the plasma treatment process, a dilute HF wet cleaning step is performed to remove damaged parts of dielectric 213 and residues from air gaps 211. After the dilute HF wet cleaning has been performed, adhesive layer 205 and protective layer 207 remain. If the percentage of adhesive layer 205 remaining after the dilute HF wet cleaning step is close to the starting percentage of adhesive layer 205, then protective layer 207 is likely an effective protective layer. In this exemplary embodiment, conformal cap layer 217 is deposited, then non-conformal cap layer 219 is deposited. In other embodiments, conformal cap layer 217 is not deposited, and only non-conformal cap layer 219 is deposited.

Figure 8:
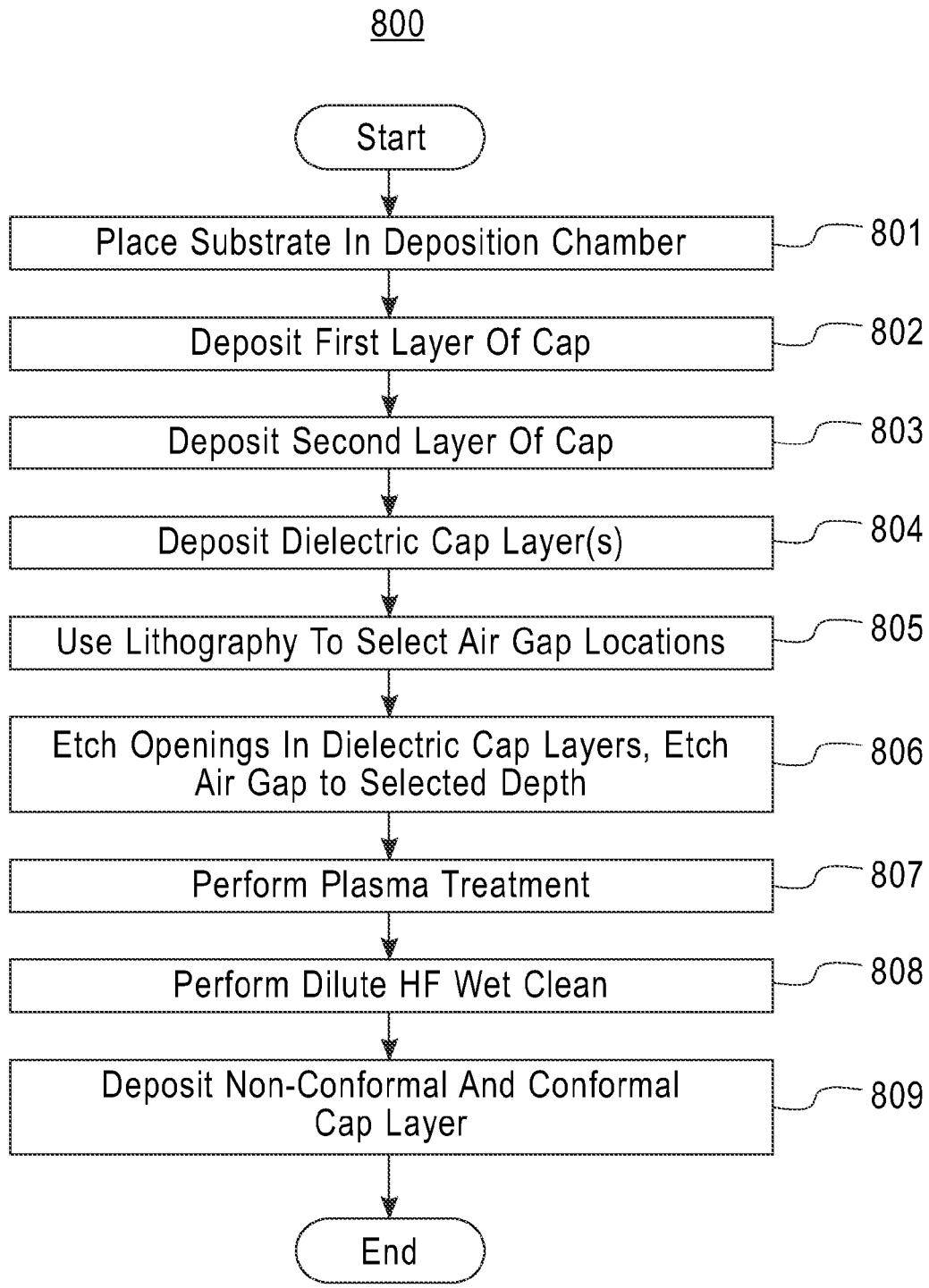
FIG. 8 depicts the steps of a flowchart for a process of forming an air gap structure with a bilayer selective cap, in accordance with an embodiment of the present invention.

FIG. 8 depicts the steps of a flowchart for a process of forming an air gap structure with a bilayer selective cap, in accordance with an illustrative embodiment.

In step 801, a wafer substrate is placed in a cap deposition chamber. In step 802, the first layer of the self-aligned bilayer cap is deposited on the substrate. The first layer is adhesive layer 205, and may be Co, for example. Subsequent to depositing the first layer of the self-aligned bilayer cap, in one embodiment of step 803, the substrate is moved to a modification chamber and the second layer of the self-aligned cap is deposited on the first layer. The second layer of the self-aligned cap may be composed of SiC or $CoSi_2$, for example. In step 804, the substrate is moved to a PECVD chamber and one or more dielectric cap layers are deposited. Using known lithography techniques, air gaps 211 locations are selected in step 805. Subsequent to selecting the air gaps 211 locations, and blocking the non-air gap locations, in step 806, openings are etched into the one or more dielectric cap layers to a selected depth. In step 807, a plasma treatment is performed, which results in a modified dielectric material. In step 808, dilute HF wet cleaning is performed to remove the damaged dielectric and residues from each air gaps 211. In an embodiment, additional wet clean steps may be performed to remove the damaged dielectric and residues from each air gaps 211. In step 809, the substrate is placed in a PECVD chamber and first conformal cap layer 217 is deposited, followed by depositing non-conformal cap layer 219. In a preferred process of forming an air gap structure, according to one embodiment of the present invention, steps 802, 803, and 804 are performed in an integrated process tool and substrate 100 is not exposed to air between these steps.

Figure 9A:
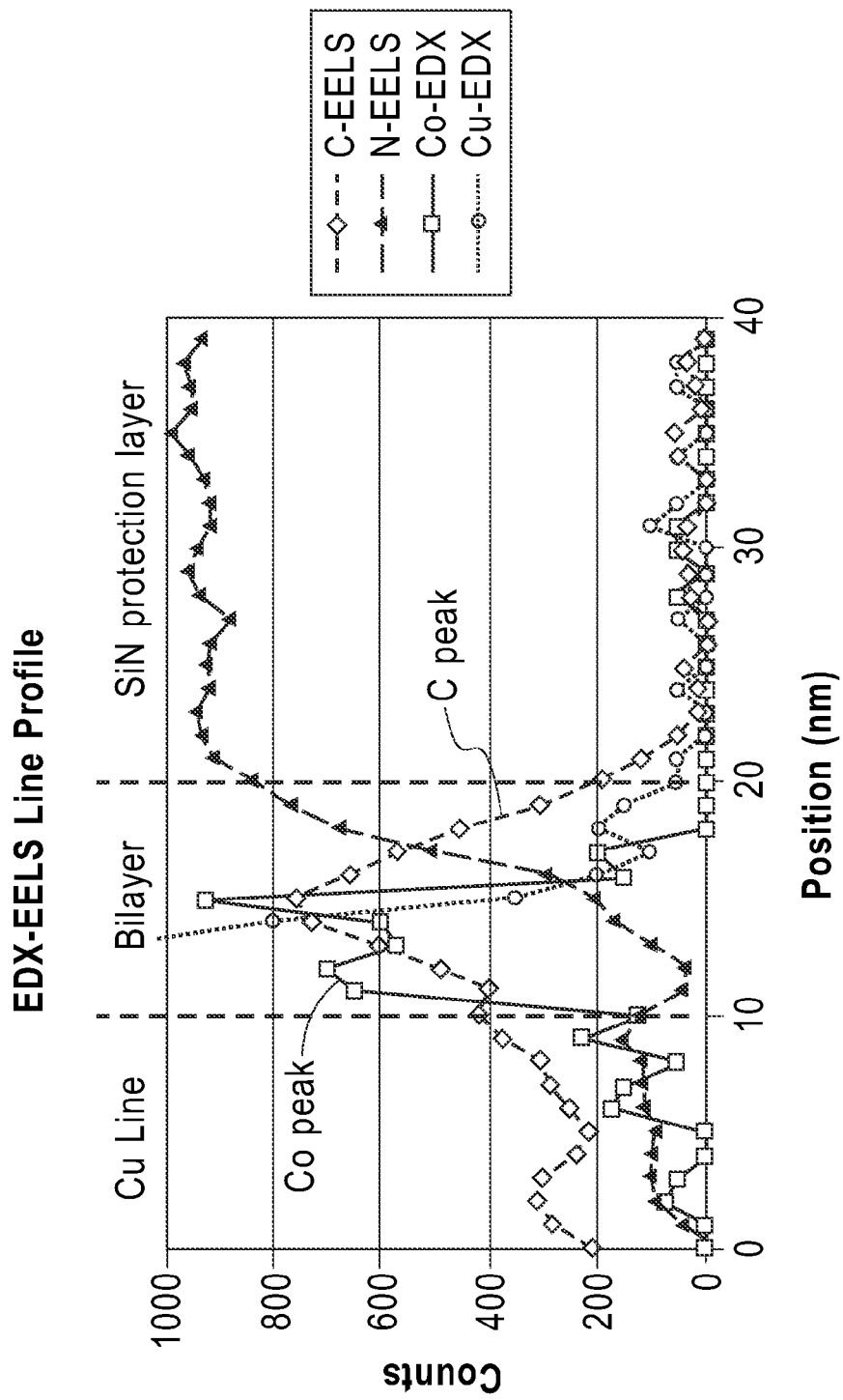
FIGS. 9A and 9B depict EDX-EELS line profiles of element peaks directly over the bilayer cap and between the conductors, respectively, in accordance with an embodiment of the present invention.
Figure 9B:
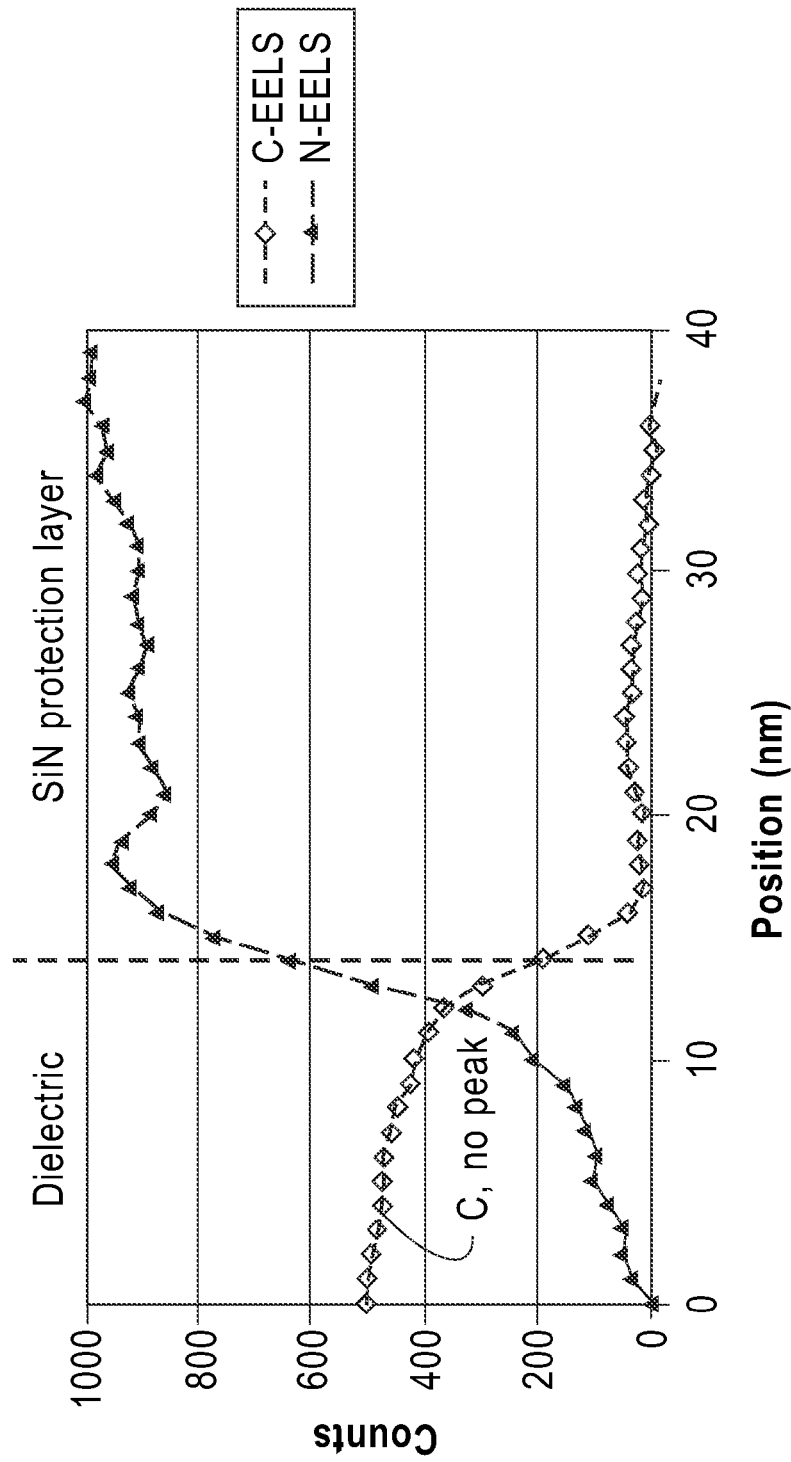

FIGS. 9A and 9B depict EDX-EELS line profiles of element peaks directly over the bilayer cap and between the conductors, respectively, in accordance with an embodiment of the present invention.

Protective layer 207 has been studied in patterned copper structures using depth profiling and time-of-flight (TOF) secondary ion mass spectrometry (SIMS), where a distinct C peak may be seen in the depth profile. Also, protective layer 207 has been studied in patterned copper structures using transmission electron microscopy (TEM) with electron energy loss (EELS) detection in a linescan mode (as depicted in FIGS. 9A and 9B), providing signals that are specific to each element. As depicted in FIG. 9A, dashed lines show general regions of the structure, which are: the Cu line, the bilayer, and the SiN protection layer. In this exemplary embodiment, the SiN protection layer covers the structure to prevent air oxidation. Using this method, the location of elements, such as C, Si, N, and Co, can be studied on the top surface of the Cu conductors. As depicted in the bilayer region of FIG. 9A, a carbon (C) peak is located on the top surface of a cobalt (Co) peak, showing that there are two layers in the bilayer cap, and that protective layer 207 is carbon-based, while adhesive layer 205 is Co, in this example. As depicted in the SiN protection layer of FIG. 9A, a high nitrogen (N) signal is detected, confirming that this is the SiN protection layer region.

As depicted in FIG. 9B, dashed lines show general regions of the structure, which are: the dielectric and the SiN protection layer. In FIG. 9B, a line profile between the Cu conductors over the ILD was measured, resulting in no C peak detected. As depicted in the SiN protection layer of FIG. 9B, a high nitrogen (N) signal is detected, confirming that this is the SiN protection layer region. FIG. 9B illustrates that the carbon-based protective layer 207 is self-aligned to the top surface of the Cu conductors.

Having described embodiments for an air gap structure including a bilayer cap with increased reliability and methods of fabrication to reduce process costs (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

In certain embodiments, the fabrication steps depicted above may be included on a semiconductor substrate, consisting of many devices and one or more wiring levels, to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A semiconductor structure comprising:
   a dielectric layer present on a semiconductor substrate;
   one or more conductors within the dielectric layer, wherein the one or more conductors have a top surface;
   a bilayer cap present on the one or more conductors, wherein the bilayer cap comprises a first layer and a second layer, and wherein the second layer comprises one or more of: CoCH, CoSiNCH, $CoSi_x$, and a capping material including SiCH, SiCNH, amorphous C, and amorphous CH; and
   a plurality of air gaps, wherein the air gaps are etched into the dielectric layer.

2. The semiconductor structure of claim 1, wherein the first layer comprises an adhesive layer, and is configured to be in adhesive contact with the one or more conductors.

3. The semiconductor structure of claim 1, wherein the second layer comprises a protective layer, and is configured to be in adhesive contact with the first layer.

4. The semiconductor structure of claim 1, wherein the bilayer cap is a self-aligned bilayer cap.

5. The semiconductor structure of claim 1, wherein the first layer comprises one or more metals including: cobalt, manganese, tantalum, ruthenium, aluminum, nickel, tungsten, platinum, palladium, and rhenium.

6. The semiconductor structure of claim 1, wherein the first layer comprises an electroless metal capping layer, wherein the electroless metal capping layer comprises one or more of: CoWP, CoWB, NiWP, and a selective CVD Ru cap.

7. The semiconductor structure of claim 1, wherein the second layer comprises a metal compound, wherein the metal compound includes: C, Si, N, and H.

8. A semiconductor structure comprising:
   a dielectric layer present on a semiconductor substrate;
   one or more Cu conductors within the dielectric layer, wherein the one or more Cu conductors have a top surface;
   a bilayer cap present on the one or more Cu conductors, wherein the bilayer cap comprises a first layer deposited on the top surface of the Cu conductors and a second layer deposited on the first layer, wherein the second layer comprises one or more of: a metal containing alloy including $MC_x$, $MN_y$, $MC_xN_y$, $MSi_xC_y$, $MSi_xN_y$, and $MSi_xN_yC_z$, wherein M is selected from Co, Mn, Ta, Re, Al, Ni, W, Pt, Pd, Re;
   a plurality of air gaps, wherein the air gaps are etched to a selected depth within the dielectric layer; and
   a conformal cap layer deposited on, at least, the top surface of the dielectric layer, and a non-conformal cap layer deposited on, at least, the top surface of the deposited conformal cap layer.

9. The semiconductor structure of claim 8, wherein the bilayer cap comprises a repeated plurality of first layers and second layers to form a multiple layer cap.

10. The semiconductor structure of claim 8, wherein the plurality of air gaps are etched to a selected depth range from 2 nm to 50 nm below the top surface of the one or more conductors.

* * * * *